US007965528B2

United States Patent
Yang et al.

(10) Patent No.: US 7,965,528 B2
(45) Date of Patent: Jun. 21, 2011

(54) METHOD AND APPARATUS FOR MEASURING THE SWITCHING CURRENT OF POWER CONVERTER OPERATED AT CONTINUOUS CURRENT MODE

(75) Inventors: Ta-Yung Yang, Milpitas, CA (US); Chuh-Ching Li, Taoyuan County (TW); Sheng-Fu Hsu, Taipei (TW); Li Lin, Taipei (TW); Jung-Sheng Chen, Kaohsiung County (TW)

(73) Assignee: System General Corporation, Sindian, Taipei County (TW)

( * ) Notice: Subject to any disclaimer, the term of this patent is extended or adjusted under 35 U.S.C. 154(b) by 365 days.

(21) Appl. No.: 12/255,089

(22) Filed: Oct. 21, 2008

(65) Prior Publication Data
US 2009/0310388 A1  Dec. 17, 2009

Related U.S. Application Data

(60) Provisional application No. 61/131,906, filed on Jun. 13, 2008.

(51) Int. Cl.
*H02M 3/24* (2006.01)
*H02M 3/335* (2006.01)
*H02M 7/44* (2006.01)

(52) U.S. Cl. ........................ 363/95; 363/21.12
(58) Field of Classification Search ................ 363/20, 363/21.01, 21.12, 21.13, 21.18, 95, 97
See application file for complete search history.

(56) References Cited

U.S. PATENT DOCUMENTS

| | | | | |
|---|---|---|---|---|
| 5,839,092 | A * | 11/1998 | Erger et al. ...................... | 702/58 |
| 7,061,225 | B2 * | 6/2006 | Yang et al. ................. | 324/103 P |
| 7,518,416 | B2 * | 4/2009 | Yang et al. .................... | 327/110 |
| 2008/0157740 | A1 * | 7/2008 | Gurcan ......................... | 323/283 |

* cited by examiner

*Primary Examiner* — Adolf Berhane
*Assistant Examiner* — Emily Pham
(74) *Attorney, Agent, or Firm* — Thomas|Kayden

(57) ABSTRACT

An apparatus for detecting a switching current of the power converter, wherein the apparatus includes a signal generation circuit, a sample-and-hold circuit, and a calculating circuit. The signal generation circuit generates a sample signal in accordance with the pulse width of a switching signal. The sample-and-hold circuit is coupled to receive the sample signal and switching current signal for generating a first current signal and a second current signal. The calculating circuit is coupled to receive the first current signal and the second current signal for generating output signals. The switching signal is used for switching the magnetic device of the power converter, and the switching current signal is correlated to the switching current of the power converter; the output signals are correlated to the value of the switching current of the power converter.

13 Claims, 8 Drawing Sheets

METHOD AND APPARATUS FOR MEASURING THE SWITCHING CURRENT OF POWER CONVERTER OPERATED AT CONTINUOUS CURRENT MODE

CROSS REFERENCE TO RELATED APPLICATIONS

The present application claims the benefit of U.S. provisional application entitled "Method and apparatus for measuring the switching current of power converter operated at continuous current mode", Ser. No. 61/131,906, filed Jun. 13, 2008.

BACKGROUND OF THE INVENTION

1. Field of the Invention

The present invention relates generally to a switching control circuit, and more specifically to a method and apparatus for detecting a switching current of a power converter operated at continuous current mode.

2. Description of the Related Art

A power converter is used to convert an unregulated power source to a regulated voltage or current source. The power converter normally includes a transformer or a magnetic device having a primary winding and a secondary winding to provide isolation. A switching device connected with the primary winding to control energy transfer from the primary winding to the secondary winding. FIG. 1 shows a conventional power converter. A controller 50 generates a switching signal $V_G$ to regulate the output of the power converter in response to a feedback signal $V_{FB}$. The feedback signal $V_{FB}$ is correlated to the output $V_O$ of the power converter. The switching signal $V_G$ drives a power transistor 20 for switching a transformer 10. The transformer 10 is connected to an input voltage $V_{IN}$ of the power converter. The energy of the transformer 10 is transferred to the output $V_O$ of the power converter through a rectifier 40 and a capacitor 45. A resistor 30 is connected serially with the power transistor 20 to generate a switching current signal $V_I$ in response to a switching current $I_P$ of the transformer 10. The switching current signal $V_I$ is coupled to the controller 50 for the control the power converter. The power converter will be operated at discontinuous current mode (DCM) when the transformer 10 is fully discharged before the start of the switching cycle. If the switching signal $V_G$ is enabled before the transformer 10 is fully discharged, the power converter will be operated at continuous current mode (CCM). A continuous current will be remained in the transformer when the power converter operated in the CCM. FIG. 2 shows a CCM waveform of the switching current $I_P$, in which the continuous current $I_A$ represents the energy stored in the transformer 10. A ramp current $I_C$ is the energy that is further charged into the transformer 10 during the on time $T_{ON}$ of this switching cycle T. The continuous current $I_A$ stands for a major energy transfer of the transformer 10. A voltage spike and noise are generated at the rising edge of the switching current $I_P$. The voltage spike and noise will generate error for the sampling. The object of the present invention is to develop a method and apparatus to measure the continuous current $I_A$ and the ramp current $I_C$ of the switching current $I_P$.

BRIEF SUMMARY OF THE INVENTION

The present invention proposes an apparatus and a method for detecting a switching current of the power converter, wherein the apparatus comprises a signal generation circuit, a sample-and-hold circuit, and a calculating circuit. Wherein the signal generation circuit generates a sample signal in accordance with the pulse width of a switching signal. The sample-and-hold circuit is coupled to receive the sample signal and switching current signal for generating a first current signal and a second current signal. The calculating circuit is coupled to receive the first current signal and the second current signal for generating output signals. Wherein the switching signal is used for switching the magnetic device of the power converter, and the switching current signal is correlated to the switching current of the power converter; the output signals are correlated to the value of the switching current of the power converter.

It is to be understood that both the foregoing general descriptions and the following detailed descriptions are exemplary, and are intended to provide further explanation of the invention as claimed. Still further objects and advantages will become apparent from a consideration of the ensuing description and drawings.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
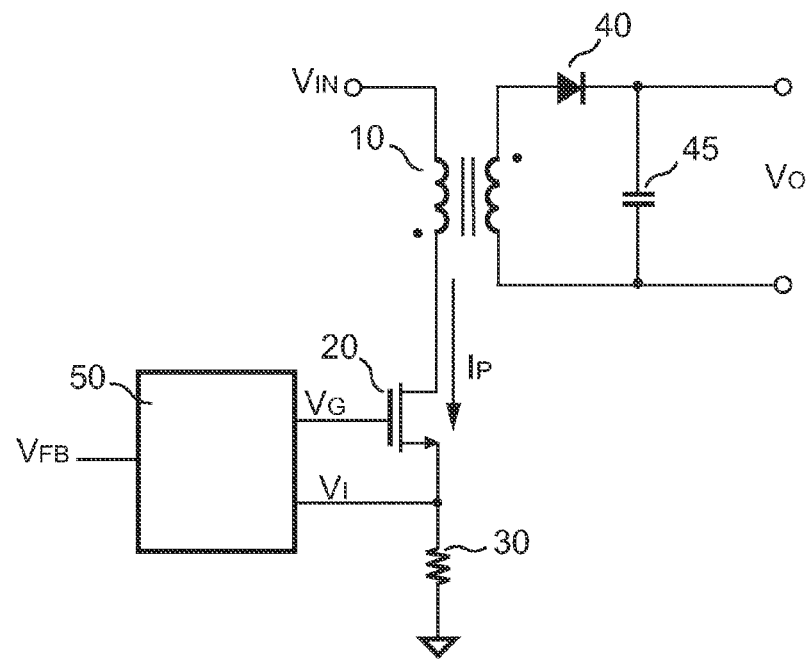
FIG. 1 is a circuit schematic diagram of a conventional power converter.
Figure 2:
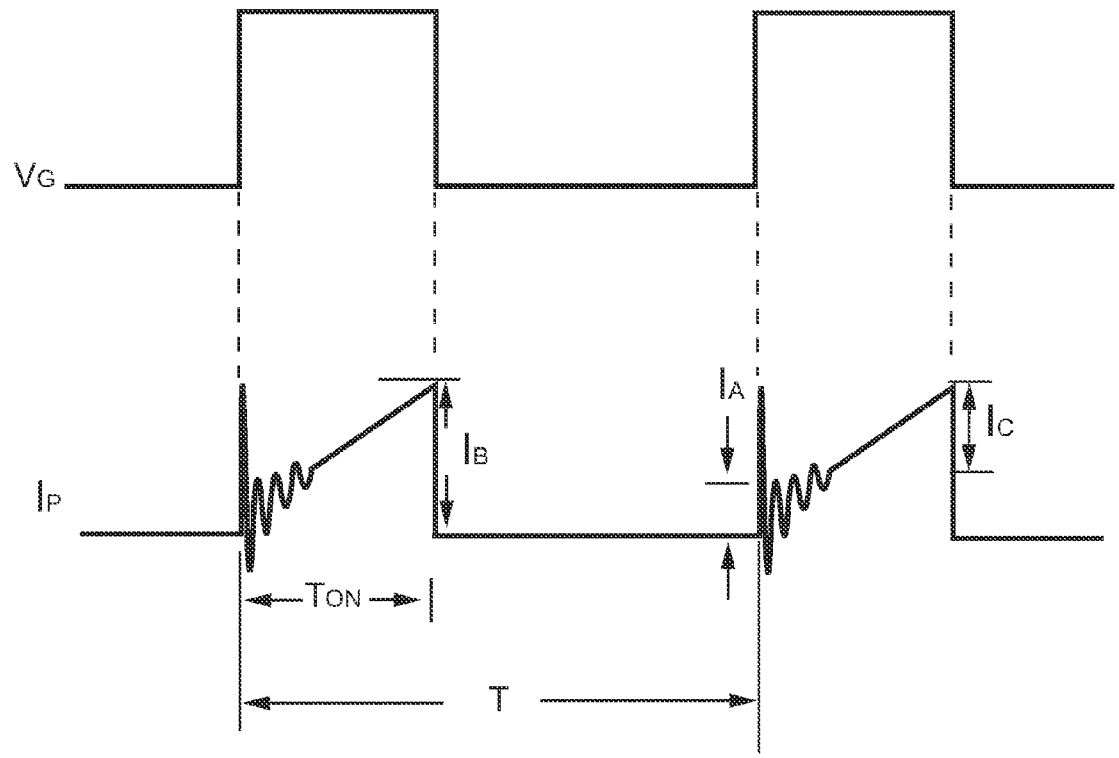
FIG. 2 shows the signal waveform of the switching current at continuous current mode (CCM)
Figure 3:
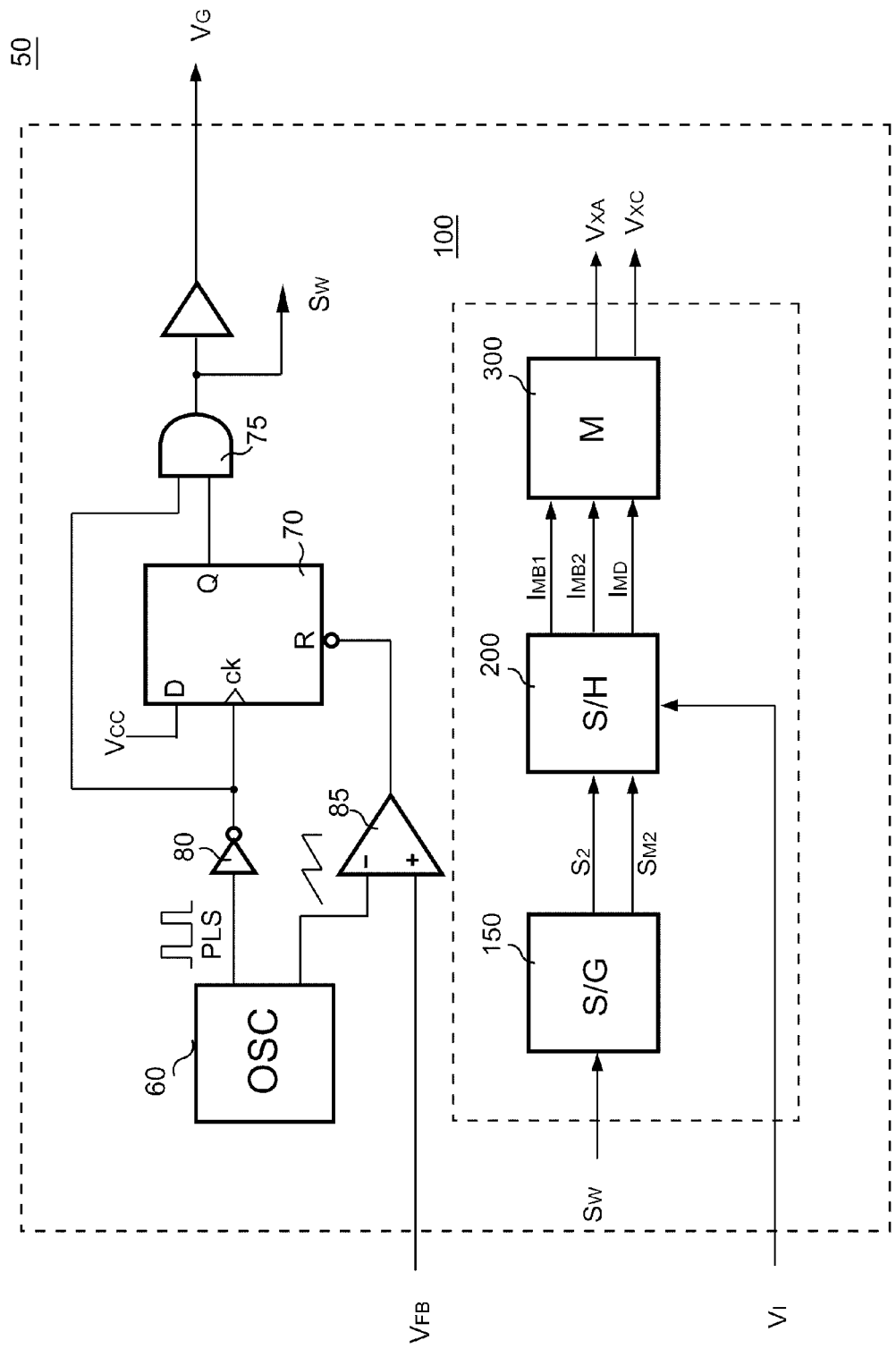
FIG. 3 is a schematic diagram of the controller in accordance with an embodiment of the present invention.

FIG. 3 is the circuit schematic of the controller 50 of the invention. A flip-flop 70 and an AND gate 75 generates switching signals $S_W$ and $V_G$ for driving the transistor 20 and switching the transformer 10 (shown in FIG. 1). A detection circuit 100 is coupled to receive the switching current signal $V_I$ for generating the DC-output signal $V_{XA}$ and the AC-output signal $V_{XC}$. The detection circuit 100 includes a signal generation circuit 150, a sample-and-hold circuit 200 and a calculating circuit 300. The signal generation circuit 150 generates a sample signal $S_2$ in accordance with the pulse width of the switching signal $S_W$. The sample-and-hold circuit 200 is coupled to receive the sample signal $S_2$ and switching current signal $V_I$ for generating a first current signal $I_{MB}$ and a second current signal $I_{MD}$. A calculating circuit 300 is couple to receive the first current signal $I_{MB}$ and the second current signal $I_{MD}$ for generating output signals DC-output signal $V_{XA}$ and the AC-output signal $V_{XC}$. The output signals DC-output signal $V_{XA}$ and the AC-output signal $V_{XC}$ are correlated to the value of the switching current $I_P$ of the power converter.

Figure 4:
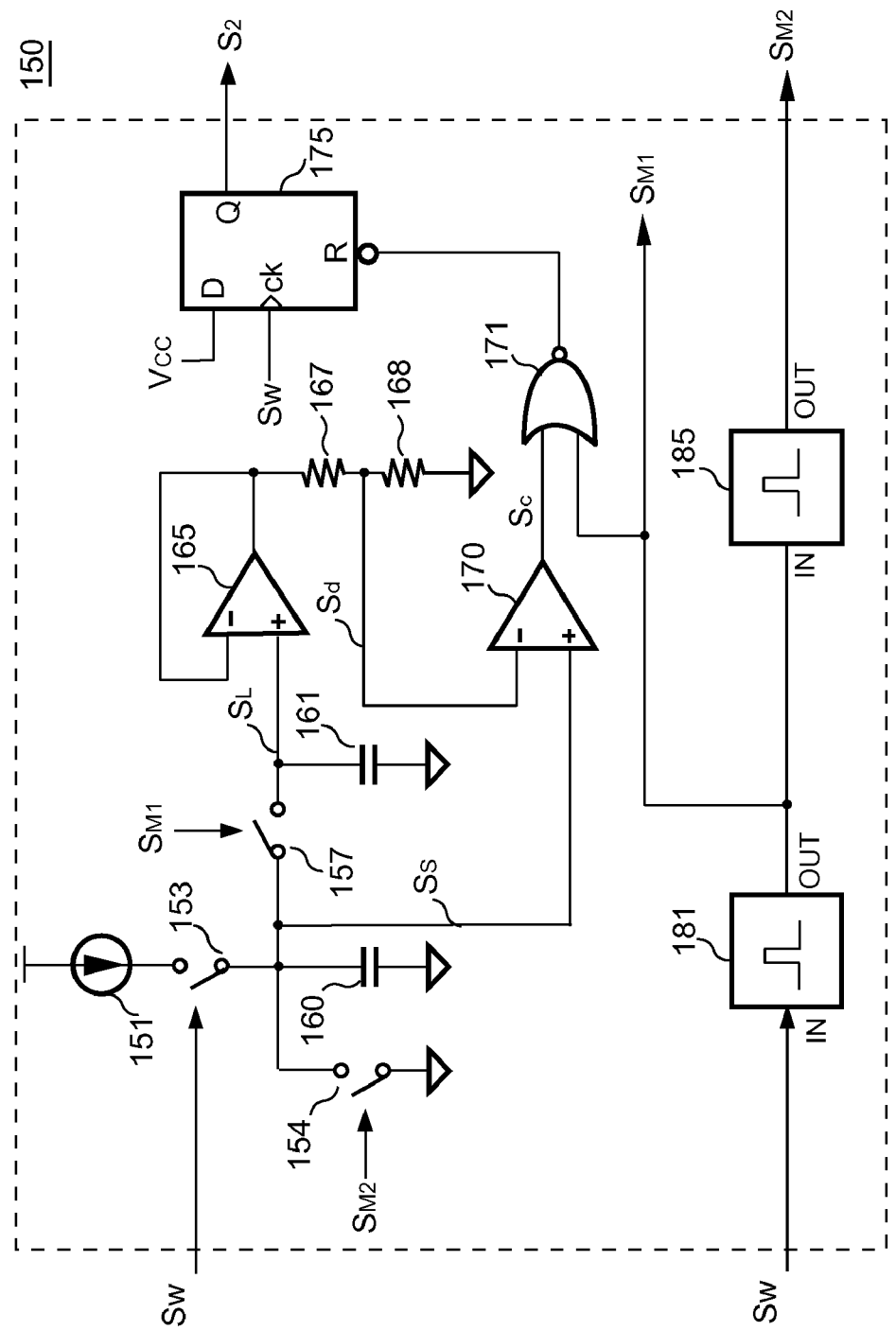
FIG. 4 shows a detailed circuit of the signal generation circuit in accordance with an embodiment of the present invention.
Figure 5:
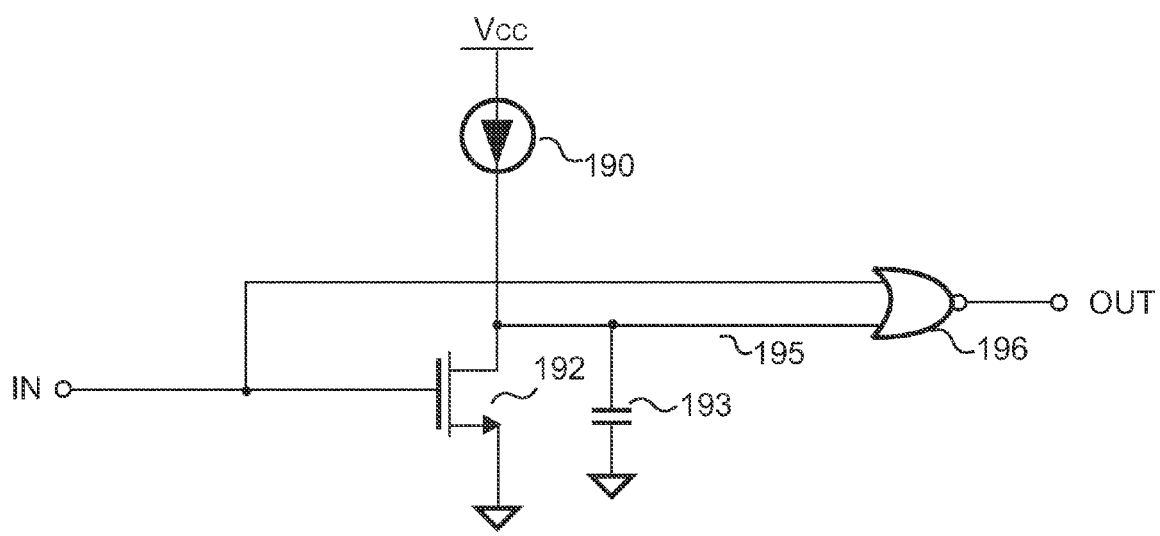
FIG. 5 shows a sample-and-hold circuit.
Figure 6:
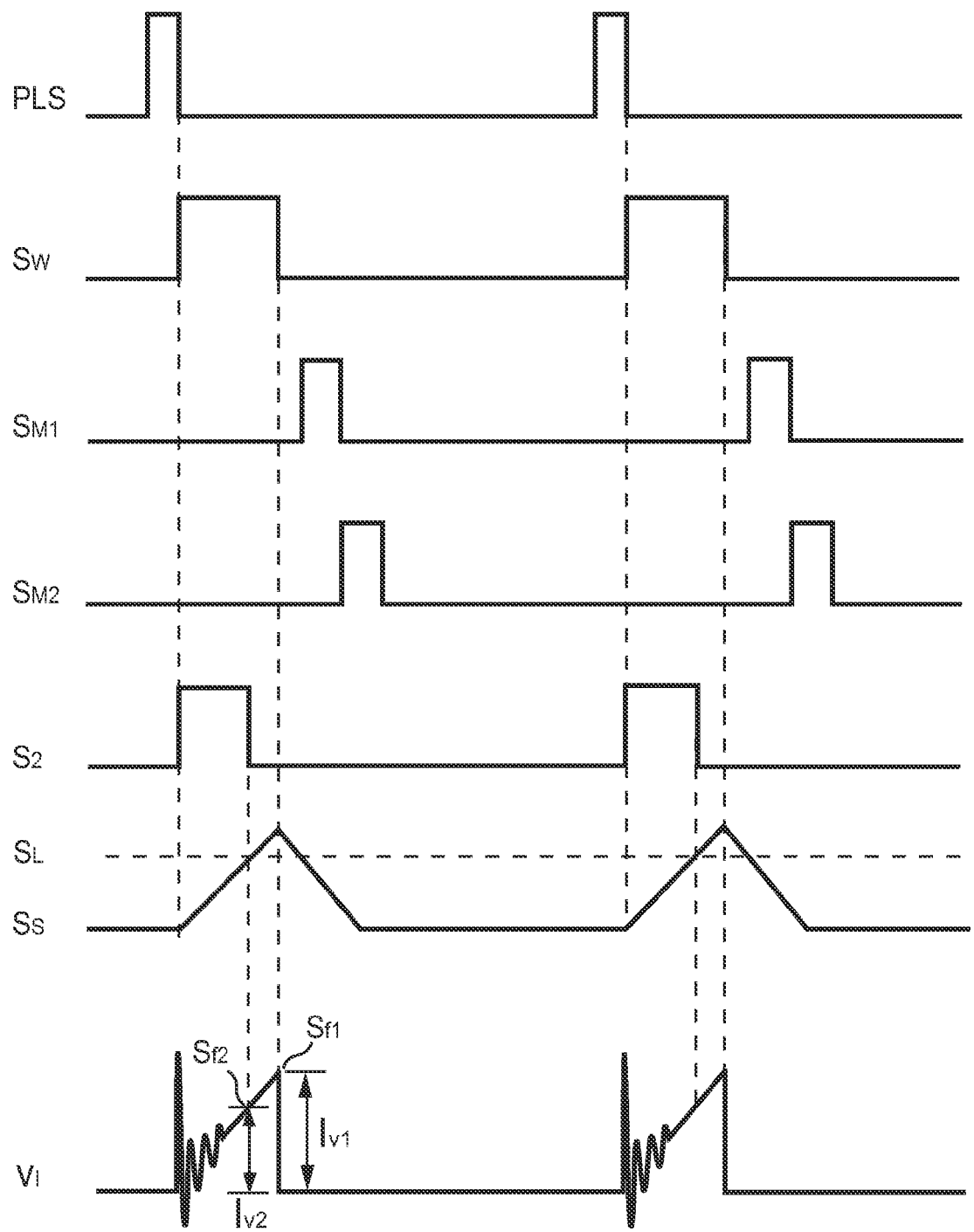
FIG. 6 shows wave forms of the circuit shown in FIG. 5 and FIG. 6.

Referring to FIG. 4 to FIG. 6, wherein FIG. 4 shows the signal generation circuit 150. It includes a charge circuit, capacitors 160, 161, and an output circuit. A current source 151 and switches 153, 154, 157 develop the charge circuit. It is coupled for charging the capacitors 160 and 161. The capacitor 160 generates a slope signal $S_S$. The capacitor 161 generates a level signal $S_L$ in response to the current charged in the capacitor 160 during last switching cycle. The level signal $S_L$ is correlated to the pulse width of the switching signal $S_W$. A divider, formed by resistors 167 and 168, generates a divided-signal $S_d$ in accordance with the level signal $S_L$ through the buffer 165. The divided-signal $S_d$ is therefore correlated to the ratio $$\left(\text{for example, } \frac{n-1}{n}\right)$$

of the level signal $S_L$. An output circuit developed by a NOR gate 171, a comparator 170 and a flip-flop 175 generates the sample signal $S_2$ in response to a comparing result signal $S_C$ and a first one shot signal $S_{M1}$. The comparing result signal $S_C$ is generated in response to the divided-signal $S_d$ and the slope signal $S_S$ through a comparator 170. The signal generation circuit 150 further comprises one shot circuits 181 and 182 for generating the first one shot signal $S_{M1}$ and a second one shot signal $S_{M2}$.

FIG. 5 shows the schematic view of the one-shot circuit such as one-shot circuits 181 and 185 shown in FIG. 4, a constant current source 190 is used to charge a capacitor 193 once a transistor 192 is turned off. The input terminal IN of the one-shot circuit 181 and 185 is connected to the gate of the transistor 192 and one input of a NOR gate 196. The other input of the NOR gate 196 is connected to the capacitor 193. Therefore, the one-shot circuit generates a one-shot signal at the output of the NOR gate 196 in response to the falling edge of the input signal of the one-shot circuit. The current of the constant current source 190 and the capacitance of the capacitor 194 determine the pulse width of the one-shot signal.

FIG. 6 shows the waveforms of the circuit illustrated in FIG. 4 and FIG. 5. Because the value of the divided-signal $S_d$ is correlated to the ratio of the level signal $S_L$, and the level signal $S_L$ is correlated to the pulse width of the switching signal $S_W$, therefore the sample signal $S_2$ is reset once the level of the slope signal $S_S$ is larger than the level signal $S_L$.

Figure 7:
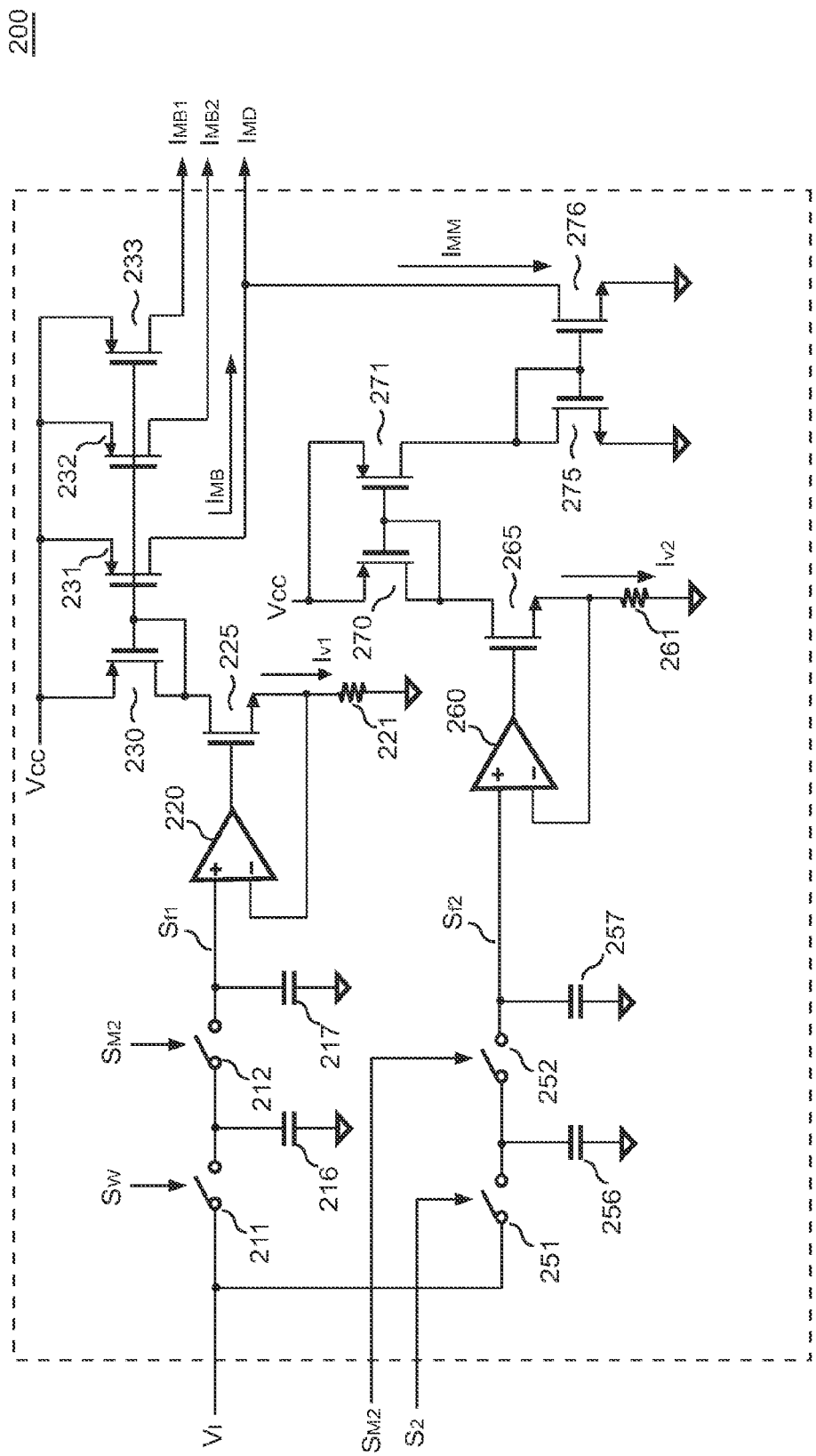
FIG. 7 shows the detailed circuit of the sample-and-hold circuit of the invention.

FIG. 7 shows an embodiment of the sample-and-hold circuit 200. Referring to FIG. 6 together. The sample-and-hold circuit 200 includes a first capacitor 216 coupled to receive the switching current signal $V_I$ for generating a first sample signal $S_{f1}$ in response to the switching signal $S_W$ and transfer the first sample signal $S_{f1}$ to the capacitor 217 in response to the second one shot signal $S_{M2}$. A second capacitor 256 is coupled to the switching current signal $V_I$ to generate a second sample signal $S_{f2}$ in response to the sample signal $S_2$ and transfer the second sample signal $S_{f2}$ to the capacitor 257 in response to the enabled second one shot signal $S_{M2}$. A first V-to-I circuit developed by an operational amplifier 220, a transistor 225 and a resistor 221 generates a first V-to-I current $I_{V1}$ in accordance with the first sample signal $S_{f1}$. A second V-to-I circuit developed by an operational amplifier 260, a transistor 265 and a resistor 261 generates a second V-to-I current $I_{V2}$ in accordance with the second sample signal $S_{f2}$. A first current mirror (transistors 230, 231, 232 and 233) generates current signals $I_{MB}$ $I_{MB1}$ and $I_{MB2}$ (first current signal) in response to the first V-to-I current $I_{V1}$. In the embodiment, the ratio of the first current mirror is equal to 1, $I_{MB}=I_{MB1}=I_{MB2}$. A second current mirror (transistors 270, 271, 275, 276) whose ratio is equal to 1 generates current signal $I_{MM}$ proportional to the second V-to-I current $I_{V2}$, and a second current signal $I_{MD}$ in response to the differential of the first current signals $I_{MB}$ and the current signal $I_{MM}$. Because the first current signal $I_{MB}$ is mirrored from the first V-to-I current $I_{V1}$, and current signals $I_{MM}$ is mirrored from the second V-to-I current $I_{V2}$, the second current signal $I_{MD}$ is therefore in proportion to the differential of the first current signals $I_{MB}$ and the current signal $I_{MM}$.

Figure 8:
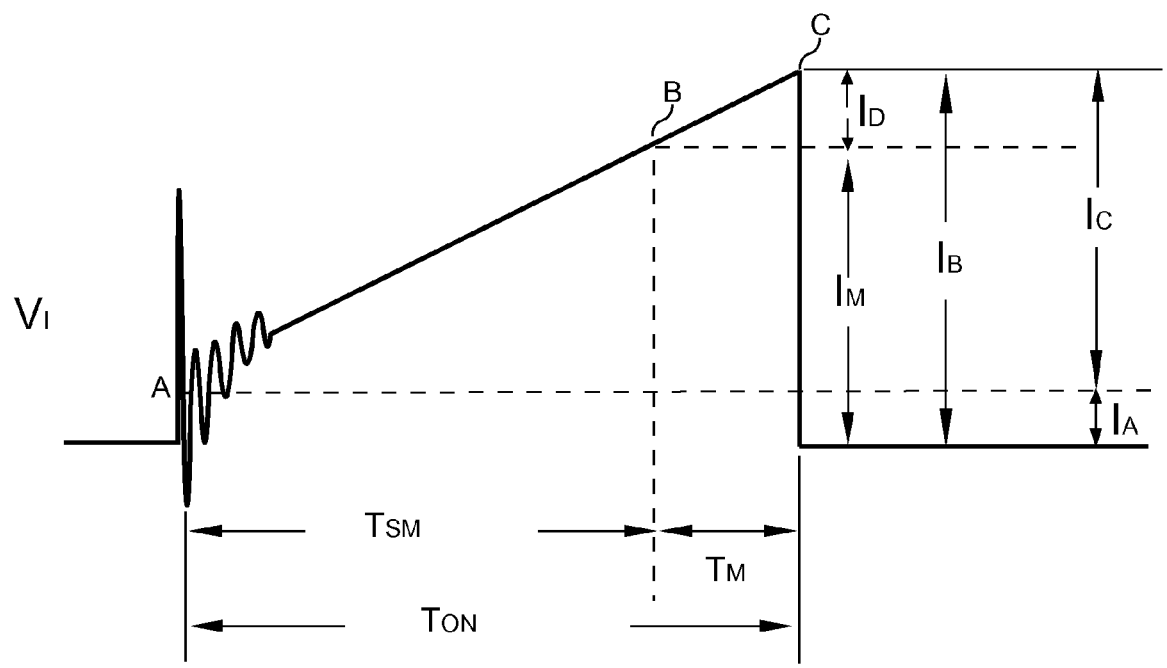
FIG. 8 shows the wave form of the switching current.

FIG. 8 shows the waveform of the switching current signal $V_I$. Point C and B represent a peak point and a sampled point in the waveform respectively. $I_B$ shows the peak current of the peak point C, and $I_M$ represents the sample current of the sample point B; $I_D$ represents the differential of the peak current $I_B$ and the sample current $I_M$. The continuous current $I_A$ represents the energy stored in the transformer 10. The ramp current $I_C$ is the energy that is further charged into the transformer 10 during the on time $T_{ON}$. The continuous current $I_A$ and the ramp current $I_C$ can be expressed, Because Slope $S_{CB}=S_{CA}$.

$$\frac{I_D}{T_M} = \frac{I_C}{T_{ON}} \tag{1}$$

$$T_{ON}=n\times T_M \tag{2}$$

$$I_D=I_B-I_M \tag{3}$$

$$I_C=n\times I_D \tag{4}$$

From the equations (1) to (4), we can get $$I_C=n\times(I_B-I_M) \tag{5}$$

$$I_A=I_B-I_C \tag{6}$$

Figure 9:
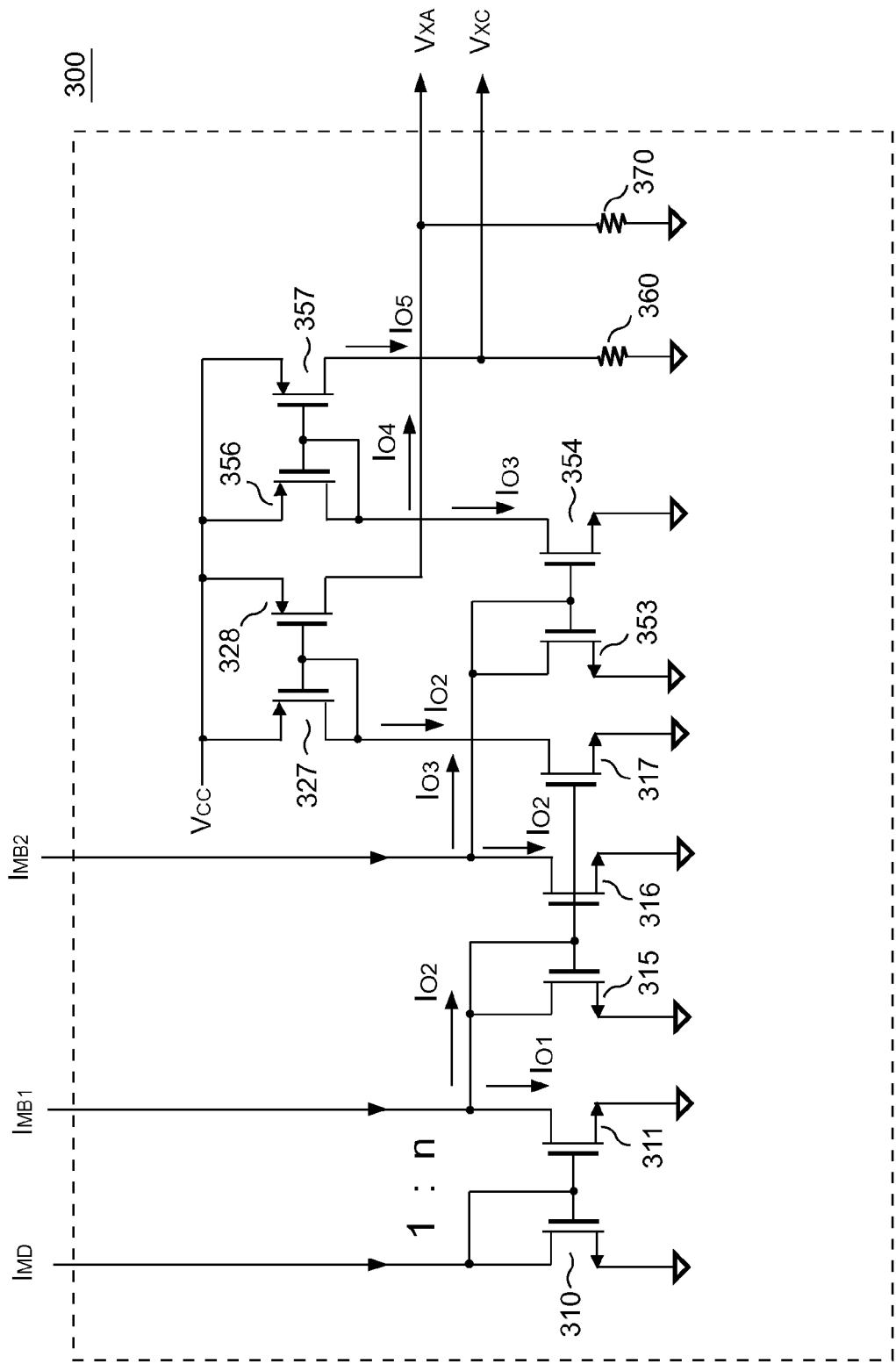
FIG. 9 shows the detailed circuit of the calculating circuit of the present invention.

FIG. 9 is the calculating circuit 300. It is couple to receive the first current signals $I_{MB1}$ and $I_{MB2}$ and the second current signal $I_{MD}$ for generating DC-output signal $V_{XA}$ and the AC-output signal $V_{XC}$. The calculating circuit 300 comprises a first current mirror (transistors 310, 311), second current mirror (transistors 315, 316, and 317) and a third current mirror (327, 328) coupled to receive the first current signal $I_{MB}$ and the second current signal $I_{MD}$ for generating the DC-output signal $V_{XA}$ through a resistor $R_{360}$. A fourth current mirror (transistors 353, 354) and a fifth current mirror (transistors 356, 357) are coupled to generate the AC-output signal $V_{XC}$. In the embodiment, the ratio of the each of the second current mirror, the third current mirror, the fourth current mirror, and the fifth current mirror is equal to 1. The current signals $I_{O1} \sim I_{O5}$ of the calculating circuit 300 can be express by, $$I_{O1}=n\times I_{MD}=n\times(I_{MB1}-I_{MM})=n\times(I_{MB}-I_{MM}) \tag{7}$$

$$I_{O2}=I_{MB1}-I_{O1}=I_{MB}-n(I_{MB}-I_{MM}) \tag{8}$$

$$I_{O3}=I_{MB2}-I_{O2}=I_{MB}-[I_{MB}-n(I_{MB}-I_{MM})]=n(I_{MB}-I_{MM}) \tag{9}$$

$$V_{XC}=I_{O5}\times R_{360}=I_{O3}\times R_{360}=n(I_{MB}-I_{MM})\times R_{360} \tag{10}$$

$$V_{XA}=I_{O4}\times R_{370}=I_{O2}\times R_{370}=[I_{MB}-n(I_{MB}-I_{MM})]\times R_{370} \tag{11}$$

From the above description, and referring to FIG. 6 to FIG. 8. The first current signal $I_{MB}$ is mirrored form the first V-to-I current $I^{V1}$, and the first V-to-I current $I_{V1}$ represents the peak current $I_B$. The current signal $I_{MM}$ is mirrored form the second V-to-I current $I_{V2}$, and the second V-to-I current $I_{V2}$ represents the sample current $I_M$. Where first current signal $I_{MB}$ and current signal $I_{MM}$ can be expressed, $$I_{MB}=I_{V1}=I_B \qquad (12)$$

$$I_{MM}=I_{V2}=I_m \qquad (13)$$

So the first signal $I_{MB}$ represents the peak current $I_B$, the current signal $I_{MM}$ represents the sample current $I_M$, Form the equations (12) and (13), the equations (10) and (11) can be expressed, $$V_{XC}=n(I_{MB}-I_{MM}) \times R_{360}=n(I_B-I_M) \times R_{360}=I_C \times K_0 \qquad (14)$$

$$V_{XA}=[I_{MB}-n(I_{MB}-I_{MM})] \times R=[I_B-n(I_B-I_M)] \times R=I_A \times K_1 \qquad (15)$$

where n is the constant of the ratio and $K_0$ and $K_1$ are constant.

So, from the equations (14) and (15), the DC-output signal $V_{XA}$ and the AC-output signal $V_{XC}$ are correlated to the value of the switching current.

In summary, we can sample the signal in accordance with the pulse width of a switching signal of the power converter, and the voltage spike and noise will not influence the sampling. The sampling is can be designed before the falling edge of the switching current $I_P$.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for detecting a switching current of a power converter, comprising:
    generating a sample signal in accordance with a pulse width of a switching signal of the power converter;
    sampling the waveform of the switching current during the period of the switching signal and the sample signal for generating a first current signal and a second current signal;
    generating output signals in accordance with the first current signal and the second current signal;
    wherein the switching signal is used for switching a transformer, and the output signals are correlated to the value of the switching current; and
    wherein a pulse width of the sample signal is a ratio of a pulse width of the switching signal.

2. The method as claimed in claim 1, in which the ratio is a constant.

3. The method as claimed in claim 2, in which the output signals are generated in accordance with the constant of the ratio.

4. The method as claimed in claim 1, in which the output signals comprising a DC-output signal and an AC-output signal, the DC-output signal is correlated to a continuous current of the switching current, and the AC-output signal is correlated to a ramp current of the switching current.

5. The method as claimed in claim 4, in which the output signals are generated in accordance with the constant of a ratio, and the AC-output signal is generated in accordance with the constant of the ratio and the differential of the first current signal and the second current signal.

6. An apparatus for detecting a switching current of the power converter, comprising:
    a signal generation circuit generating a sample signal in accordance with a pulse width of a switching signal;
    a sample-and-hold circuit configured to receive the sample signal and switching current signal for generating a first current signal and a second current signal; and
    a calculating circuit configured to receive the first current signal and the second current signal for generating output signals;
    wherein the switching signal is used for switching a transformer, and the output signals are correlated to the value of the switching current of the power converter; and
    wherein a pulse width of the sample signal is a ratio of a pulse width of the switching signal.

7. The apparatus as claimed in claim 6, in which the ratio is a constant.

8. The apparatus as claimed in claim 6, in which the sample-and-hold circuit is configured to sample the switching current signal during a period of the switching signal and the sample signal.

9. The apparatus as claimed in claim 6, in which the output signals comprise a DC-output signal and an AC-output signal, the DC-output signal is correlated to a continuous current of the switching current, and the AC-output signal is correlated to the ramp current of the switching current.

10. The apparatus as claimed in claim 9, in which the output signals are generated in accordance with the constant of a ratio, and the AC-output signal is generated in accordance with the constant of the ratio and the differential of the first current signal and the second current signal.

11. The apparatus as claimed in claim 6, in which the signal generation circuit, comprising:
    a charge circuit coupled to charge a capacitor and generate a slope signal and a level signal in response to the switching signal;
    a divider generating a divided-signal in accordance with the level signal; and
    an output circuit generating the sample signal in response to the divided-signal and the slope signal
    wherein the level signal is correlated to the pulse width of the switching signal, and the divided-signal is a ratio of the level signal.

12. The apparatus as claimed in claim 6, in which the sample-and-hold circuit, comprising:
    a first capacitor coupled to the switching current signal to generate a first sample signal in response to the switching signal;
    a second capacitor coupled to the switching current signal to generate a second sample signal in response to the sample signal;
    a first V-to-I circuit to generate a first V-to-I current in accordance with the first sample signal;
    a second V-to-I circuit to generate a second V-to-I current in accordance with the second sample signal;
    a first current mirror generating the first current signal in response to the first V-to-I current; and
    a second current mirror generating the second current signal in response to the differential of the first V-to-I current and the second V-to-I current.

13. A method for detecting a switching current of a power converter, comprising:

generating a switching current signal in accordance with the switching current of the power converter;

defining a peak point and a sampled point in a waveform of the switching current signal;

calculating output signals according to the slope between the peak point and the sampled point; and generating a continuous current and a ramp current in response to a current and a pulse width of the sample point and the peak point, wherein the output signals comprise a DC-output signal and an AC-output signal, the DC-output signal is correlated to the continuous current of the switching current, and the AC-output signal is correlated to the ramp current of the switching current.

* * * * *